United States Patent [19]

Woerlee et al.

[11] Patent Number: 5,550,773
[45] Date of Patent: Aug. 27, 1996

[54] SEMICONDUCTOR MEMORY HAVING THIN FILM FIELD EFFECT SELECTION TRANSISTORS

[75] Inventors: Pierre H. Woerlee; Cornelis M. Hart, both of Eindhoven, Netherlands

[73] Assignee: U.S. Philips Corporation, New York, N.Y.

[21] Appl. No.: 380,536

[22] Filed: Jan. 30, 1995

[30] Foreign Application Priority Data

Jan. 31, 1994 [BE] Belgium .................................. 9400108

[51] Int. Cl.⁶ .................................................. G11C 11/34
[52] U.S. Cl. .............................. 365/185.23; 365/185.33; 365/185.01
[58] Field of Search ........................ 365/185, 87, 230.06, 365/900, 185.33, 185.23, 185.01

[56] References Cited

U.S. PATENT DOCUMENTS

| 4,430,648 | 2/1984 | Togashi et al. ........................ 345/205 |
| 4,881,114 | 11/1989 | Mohsen et al. ............................ 357/54 |
| 5,136,540 | 8/1992 | Hayashi et al. ......................... 365/185 |
| 5,144,392 | 9/1992 | Brotherton ............................... 257/350 |

FOREIGN PATENT DOCUMENTS

| 0599388 | 6/1994 | European Pat. Off. . |
| 2103880 | 2/1983 | United Kingdom . |

Primary Examiner—David C. Nelms
Assistant Examiner—Huan Hoang
Attorney, Agent, or Firm—Steven R. Biren

[57] ABSTRACT

The invention relates to a semiconductor memory with a semiconductor body which is provided at a surface with a system of memory elements arranged in rows and columns. For addressing, the surface is provided with a system of mutually adjacent parallel selection lines 4, each coupled at one end to a selection transistor 19 with which the connection between the selection line and peripheral electronics can be opened or closed. These transistors are thin-film transistors which are formed, for example, in the selection lines themselves. As a result of this, the selection lines, and thus also the memory elements in the matrix, can be provided with minimum pitch.

14 Claims, 4 Drawing Sheets

SEMICONDUCTOR MEMORY HAVING THIN FILM FIELD EFFECT SELECTION TRANSISTORS

BACKGROUND OF THE INVENTION

The invention relates to a semiconductor device with a semiconductor body which is provided at a surface with a system of memory elements arranged in rows and columns and with a system of mutually adjacent, parallel selection lines which form row or column conductors for addressing the memory elements and which are each connected at an end to a selection transistor with which the connection between said conductor and peripheral electronics can be closed and opened.

Although the principle of the invention may be applied equally advantageously in a semiconductor device with a random-access memory, usually referred to in the literature by means of acronyms such as SRAM and DRAM, as will become clear below, the invention is particularly important for programmable non-volatile memories and (programmable) read-only memories (ROM) because of the high densities and/or voltages used therein. A widely used version of a programmable non-volatile memory is based on the use of a floating gate, wherein programming takes place by means of an electric charge applied to the floating gate, determining the threshold voltage of a MOST. The row conductors form, for example, the word lines by which a word can be selected in the memory matrix, whereas the column conductors act as bit lines. In another type of non-volatile memory for which the invention is particularly important, and which is described inter alia in U.S. Pat. No. 4,881,114, the memory elements comprise a thin dielectric layer between crossing silicon conductors of opposed conductivity types. In a specific embodiment, one of these conductors is formed by a surface zone in the semiconductor body, while the other one is formed by a poly layer deposited on the dielectric layer. Programming takes place here in that a voltage is applied between these conductors such that electric breakdown occurs across the dielectric layer, a pn junction arising between the conductors as a result. For the sake of simplicity, the selection lines will be referred to as word lines hereinafter also for this version. It should be noted, however, that the functions of word lines and bit lines may be interchanged in some versions.

For the purpose of addressing the memory elements, the peripheral electronics are provided inter alia with circuits with which an address is decoded into a signal for a selected line which is connected to the decoding circuit via a selection transistor. Usually the selection transistor is formed together with the remaining peripheral electronics in the semiconductor body. Given the continuous miniaturization owing to which the number of elements per unit surface area increases, the distances between the row conductors as well as the distances between the column conductors will become smaller and smaller. This miniaturization must correspond to the smallest dimensions in the peripheral electronics if a high packing density is to be realized in the matrix. The space necessary for controlling, for example, the word lines is found to be an important constraint with dimensions in the sub-micron range. In usual embodiments, the transistors are formed in the monocrystalline silicon and connected to row or column conductors provided on an oxide layer via contact windows in the oxide layer. It is not possible then to give the conductors a minimum pitch because of tolerances which are to be taken into account here. The fact that typical values of voltages applied to the word lines of an EPROM or a flash-EPROM for writing or erasing lie in a region between 12 and 16 V should also be taken into account with a further reduction of the dimensions. This means for silicon that, if electric breakdown is to be avoided, usual MOS transistors manufactured in the semiconductor body, mutually separated by field oxide and controlling adjacent word lines must be at least approximately 0.5 µm removed from one another. Because of the necessary tolerances to be taken into account in designing, the minimum distance between adjacent word lines will be in excess of 0.5 µm, so that it is useless to make the pitch in the memory matrix smaller than that. In summary, accordingly, the cell size may be substantially determined by the design rules in the periphery, so that in practice the cells are greater than they would have been if no attention were paid to the periphery in the design of the cell. This problem increases relatively in proportion as the minimum dimensions become smaller and/or the number of cells in the memory increases.

SUMMARY OF THE INVENTION

The invention has for its object inter alia to increase the packing density of the memory in that minimum dimensions are used also in the periphery. The invention further envisages to offer a possibility of reducing the dimensions within the memory matrix without being hampered by electric breakdown in the periphery.

The invention is based on the recognition inter alia that this may be achieved in that the periphery is constructed at least partly in the thin-film technology. A semiconductor device according to the invention is characterized in that the selection transistors are formed by thin-film field effect transistors with a semiconductor layer provided on an insulating layer which covers the semiconductor body. In embodiments in which the row or column conductors consist of deposited semiconductor material, the selection transistors may be manufactured in the same semiconductor layer, whereby contacts between these transistors and conductors are avoided. Since the selection transistors are mutually separated completely by dielectric material, the risk of breakdown is very small, also at very small distances, at least much smaller than if the transistors were provided in the semiconductor body itself.

A major embodiment of a semiconductor device according to the invention, in which a very high density can be obtained through the absence of alignment tolerances, is characterized in that the conductors each comprise a conductor track of doped silicon, and in that the selection transistor is formed by a field effect transistor whose source and drain zones are realized in said conductor track of doped silicon, while the portion of the conductor track situated between the source and drain zones forms the channel region of the transistor, which region is separated from a gate electrode by a dielectric layer.

An embodiment which has the advantage inter alia that no extra wiring layer is required for the gate electrode of the thin-film transistor, is characterized in that the conductor track is electrically insulated from the semiconductor body by the dielectric layer at the area of the selection transistor, and the gate electrode is formed by a surface zone of the semiconductor body. Such an embodiment of the selection transistor may be used, for example, in a semiconductor device in which the conductors each form a word or bit line of a programmable read-only memory, while the conductors are formed by conductor tracks of polycrystalline silicon of a first conductivity type which, seen at the surface, cross strip-shaped surface regions of the second, opposed conductivity type defined in the semiconductor body, lying next to one another, and electrically insulated from one another, and which are separated from these surface regions by an interposed insulating layer whose thickness is so chosen that, upon the application of a sufficiently high voltage between a selected row conductor and a selected surface region, electric breakdown occurs across the insulating layer at the area of the crossing point under formation of a pn junction between the row conductor and the surface region in the semiconductor body.

An embodiment which may be advantageously used in integrated circuits with a multilayer poly wiring is characterized in that the gate electrode is formed by a conductive layer which is situated between the semiconductor body and the portion of said conductor track in which the source and drain zones and the channel region of the selection transistor are defined. This embodiment may be used, for example, in a semiconductor device in which the conductor forms a word line of a non-volatile programmable memory in which each memory element comprises a field effect transistor with a floating gate provided above a channel of the field effect transistor and with a control gate which is conductively connected to the word line.

BRIEF DESCRIPTION OF THE DRAWING

The invention will be explained in more detail with reference to several embodiments and the accompanying diagrammatic drawing, in which.

Figure 1:
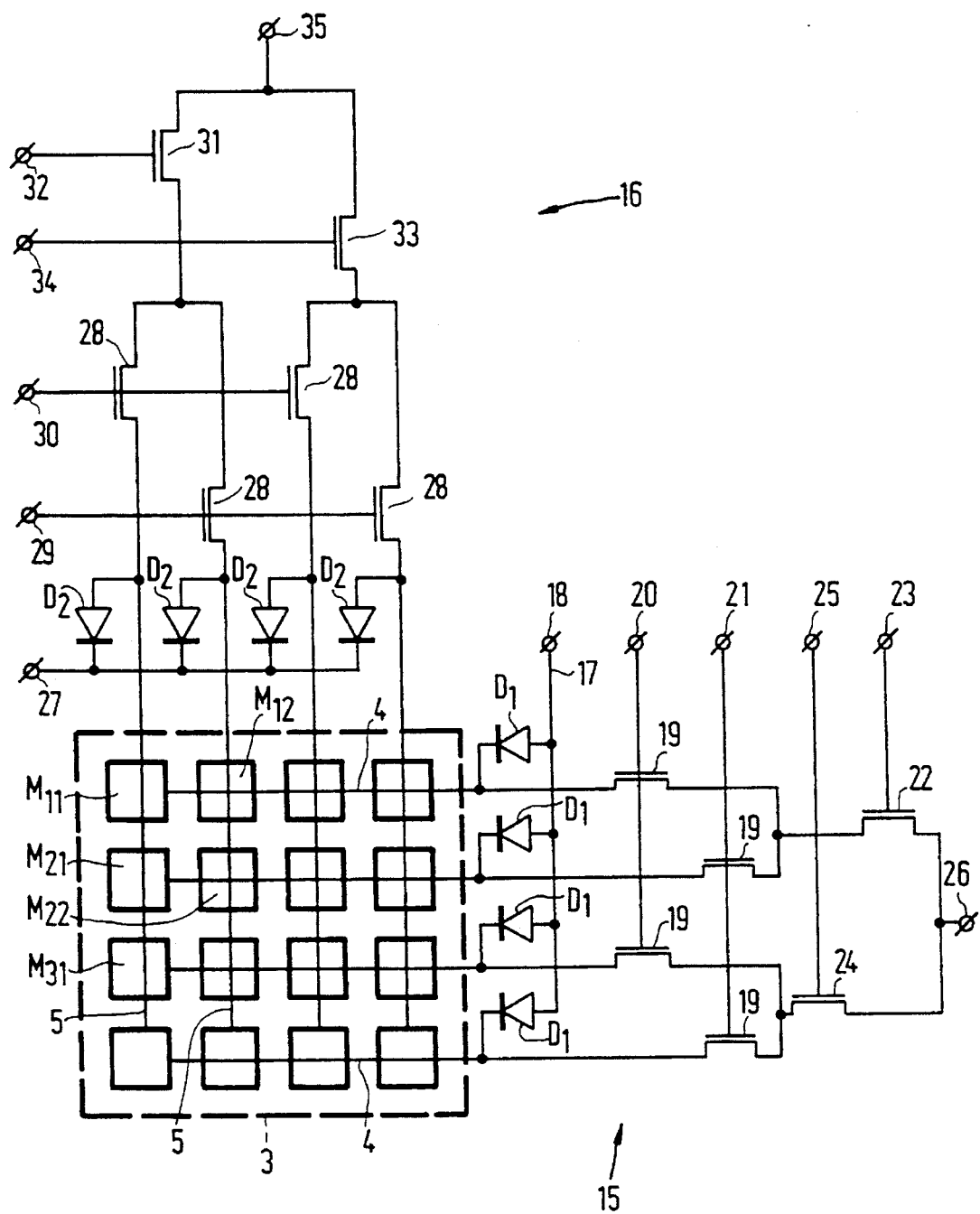
FIG. 1 is a circuit diagram of a first embodiment of a semiconductor device according to the invention.

It is noted that the drawing is diagrammatic and that the various components are not drawn to scale. Semiconductor regions of a certain conductivity type are generally hatched in the same direction.

DESCRIPTION OF THE PREFERRED EMBODIMENTS

Figure 2:
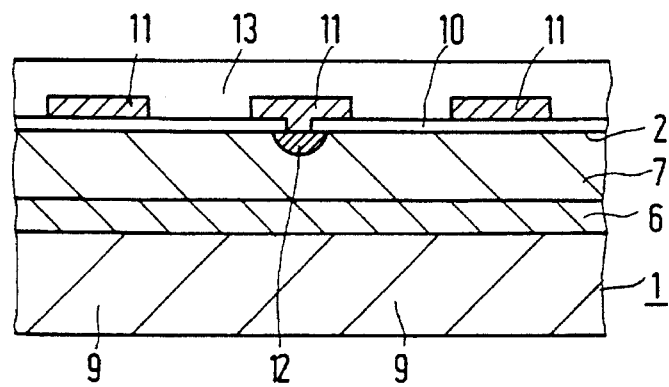
FIG. 2 is a cross-section of the memory in this device taken on a bit line.
Figure 3:
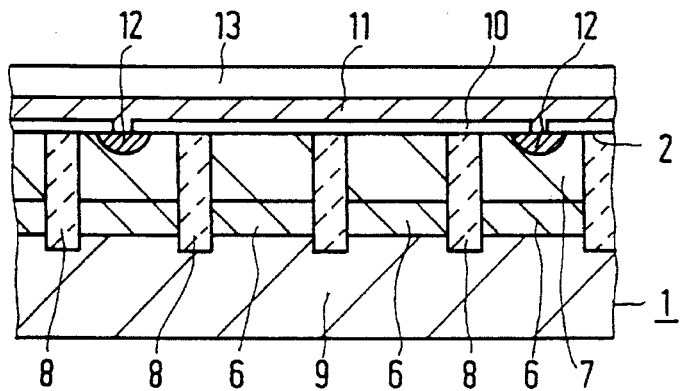
FIG. 3 is a cross-section of this memory taken on a word line.

The device pictured in FIGS. 1–5 comprises a monocrystalline semiconductor body 1 which in this example is made of silicon but which obviously may also be made of an alternative suitable semiconductor material. The body is provided with a system of memory elements $M_{ij}$ at or adjacent its surface 2, the indices i and j relating to the row and the column, respectively, of the matrix. FIG. 1 shows a 4*4 matrix by way of example, but in actual fact the number of memory elements will obviously be much greater. For addressing, the memory elements are connected to selection lines 4 which form row conductors and to selection lines 5 which form column conductors. The memory 3 is formed by a programmable read-only memory or PROM of a type described inter alia in U.S. Pat. No. 4,881,114 and in European Patent Application 92203576.1 filed on Nov. 20$^{th}$, 1992, in which the memory cells are formed by crossing lines of opposed conductivity types, mutually separated by a thin dielectric layer. During programming, a voltage is applied between the conductors of such polarity and value that electric breakdown occurs in the dielectric layer, whereby the conductors are interconnected by a rectifying junction. Each column conductor 5 comprises a low-ohmic buried zone 6 of the one conductivity type, in this case the p-type, which is separated from the surface 2 by a comparatively high-ohmic region 7 of the same conductivity type. Adjacent columns are, as shown in FIG. 3, electrically separated from one another by insulating grooves 8. If so desired, these grooves may be filled up in known manner with, for example, silicon oxide or, for example, a combination of silicon oxide and polycrystalline silicon, in order to obtain a plane upper surface. The grooves extend from the surface 2 down into a subjacent portion 9 of the semiconductor body of the opposed conductivity type, so the n-type in the present example. The surface 2 is covered with a thin dielectric layer 10 which may be of silicon oxide, but which is preferably composed of a lower layer of silicon oxide of approximately 2 nm thickness and a superimposed layer of silicon nitride of approximately 6 nm thickness, and a layer of silicon oxide formed on the nitride to a thickness of approximately 2 nm. The row conductors 4 are formed by tracks 11 of semiconductor material, in particular of polycrystalline silicon, having a conductivity type opposed to that of the regions 6 and 7, so the n-type in this example. The doping concentration of the poly tracks 11 is comparatively high, i.e. so high in relation to the doping concentration in the regions 7 that upon breakdown across the dielectric layer 10 impurities diffuse from the poly into the regions 7, forming an n-type zone there which creates a pn junction with the relevant p-type region 7. Such an n-type zone 12 is shown in FIG. 2; FIG. 3 shows two such zones. A usual glass layer 13 is provided over the entire assembly.

The semiconductor device described thus far may be manufactured by known techniques, starting with an n-type substrate 9 which is provided with p-type zones at its surface at the areas where the buried zones 6 are to be formed. An n-type epitaxial layer is provided thereon and provided with comparatively weakly doped p-type surface regions 7. Further regions and layers may be formed by standard methods, and are accordingly not described in any detail here.

For the description of the manner in which the memory can be programmed, it is assumed that breakdown occurs across the dielectric layer 10 at a voltage of 10 V. For writing a certain cell, a voltage of −10 V is applied to the selected n-type poly track 11, while a voltage of 0 V is applied to the selected p-type buried zone 6. At these voltages, holes are pulled to the surface in the p-type region 7, so that the 10 V is entirely across the dielectric layer 10 and causes an electric breakdown whereby a connection is formed with a diode 12 between the selected lines 4 and 5. A voltage of 0 V is applied to the non-selected n-type poly tracks 11, and a voltage of −10 V is applied to the non-selected p-type buried layers 6 (column conductors 5). A voltage of 0 V is applied between the row and column conductors of halfselected cells, so that no breakdown takes place. In the remaining non-selected cells, the field across the dielectric layer 10 has a polarity such that depletion takes place in the regions 7 below the poly tracks. As a result, only a portion of the 10 V voltage is applied across the dielectric layer, insufficient for breakdown.

As is shown in FIG. 1, the row conductors 4 are connected to means 15 for controlling the row conductors. Similarly, means 16 are present for controlling the column conductors 5. The means 15 comprise a range of precharge diodes $D_1$ whose cathodes are conductively connected to respective row conductors 4 and whose anodes are connected to a common conductor 17 and a connection terminal 18. In a practical embodiment, the conductor 17 may be formed by a p-type zone provided in the semiconductor body and identical to the zones 6, 7 of the column conductors in the memory matrix 3 which are connected through contact windows and a pn junction to the n-type poly tracks 11 forming the row conductors 4, this pn junction coinciding substantially with the boundary surface between the mono- and polycrystalline material. The row conductors 4 are further connected to selection transistors 19, formed by MOS transistors in the present example. The transistors 19 are controlled by input signals supplied through terminals 20 and 21, the first and third row conductor (counted from top to bottom) being controlled by the signal at terminal 20 and the second and fourth row conductor by the signal at terminal 21. The transistors 19 at the first and second row conductor are connected to a selection transistor 22 which is controlled by an input signal at terminal 23. The transistors 19 belonging to the bottom two row conductors 4 are connected to a selection transistor 24 which is controlled by an input signal at terminal 25. The transistors 19 together with the transistors 22 and 24 form four AND gates by means of which each row conductor can be selected. The transistors 22 and 24 are jointly connected to a terminal 26 to which a suitable voltage is applied.

In an analogous manner, the means 16 comprise a range of precharge diodes $D_2$ whose anodes are connected to the p-type column conductors 5 and whose cathodes are connected to a joint connection terminal 27. The column conductors 5 are further connected to selection transistors 28 whose gates are connected two-by-two to terminals 29 and 30. The transistors are again connected two-by-two in series with the transistors 31 and 33, which are controlled by signals at terminals 32, 34, respectively. The transistors 31 and 33 are further connected to a terminal 35 to which the voltage to be passed on to the column conductors 5 is applied. During programming, the row conductors are set at a voltage of 0 V via the precharge terminal 18 and the diodes $D_1$. After precharging through the diodes $D_1$, the terminal 26 is set at −10 V, which voltage is applied to the selected row conductor 4 via one of the selection transistors 19 and the transistor 22 or 24. Similarly, the column conductors are precharged at a low voltage of −10 V via the diodes $D_2$ and the terminal 27, and the selected column conductor 5 is brought to the high voltage of 0 V via the terminal 35, transistor 31 or 33, and one of the transistors 28.

Figure 4:
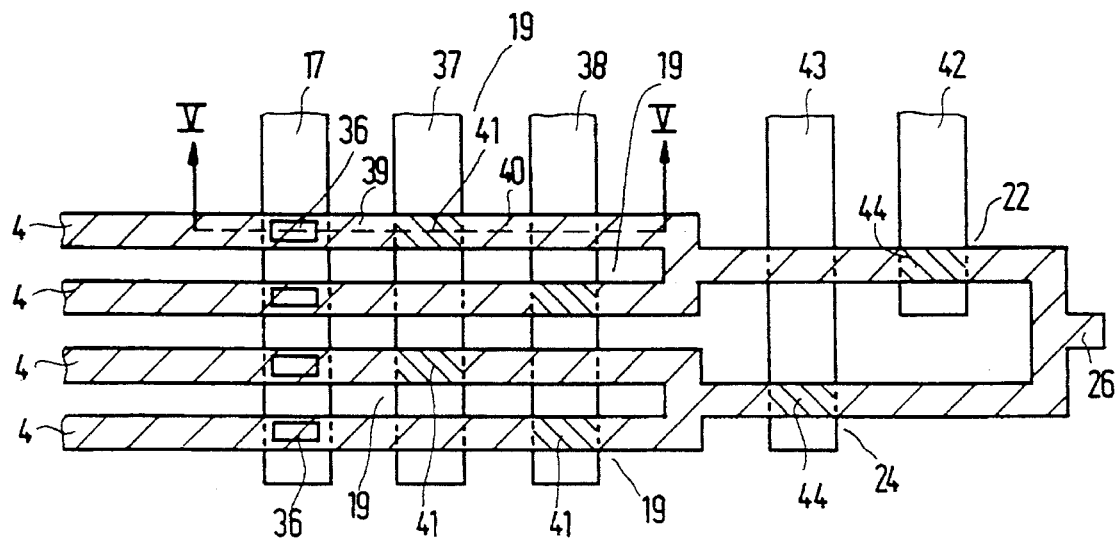
FIG. 4 is a plan view of a portion of this device.
Figure 5:
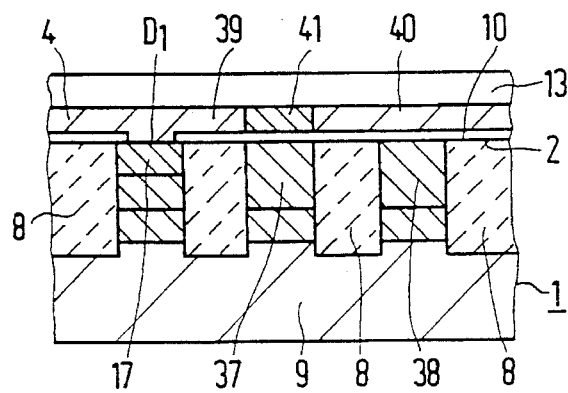
FIG. 5 is a cross-section of this device taken on the line V—V in FIG. 4.

FIGS. 4 and 5 show in plan view and cross-section, respectively, the control portion 15 with the precharge diodes $D_1$ and the selection transistors 19, 22 and 24. FIG. 4 shows the four row conductors 4 consisting of n-type doped poly tracks. Contact windows 36 are formed in the dielectric layer 10, at which windows the n-type poly tracks 4 form pn junctions $D_1$ with the p-type surface zone 17 in the semiconductor body. The p-type surface zones 37 and 38 are provided next to the p-type zone 17, forming the gate electrodes of the thin-film transistors 19. FIG. 5 shows one of these transistors whose source and drain zones are formed by the n-type doped portions 39 and 40 of the poly track and whose channel region is formed by the p-type doped portion 41. The channel region 41 is situated above the gate electrode 37 such that a suitable voltage applied to the gate 37 forms an n-type inversion layer over the entire length of the channel region, interconnecting the regions 39 and 40. In practice, the gate electrode 37 may for this purpose be so designed that it projects slightly from the channel region on either side. When a selection transistor of the depletion type is used, which is also possible, for example with a weakly n-type doped channel region between strongly doped source and drain regions, such an overlap is obviously not necessary. In the present embodiment, in which the selection transistors are of the enhancement type, the manufacture may be based, for example, on a comparatively weakly doped p-type poly layer which is redoped by means of phosphorus or arsenic atoms, with the exception of the channel regions. Critical masking steps for the manufacture of the selection transistors are not necessary in the embodiment shown here, in which the source and drain zones and the channel region extend transversely across the width of the poly tracks 4.

Figure 13:
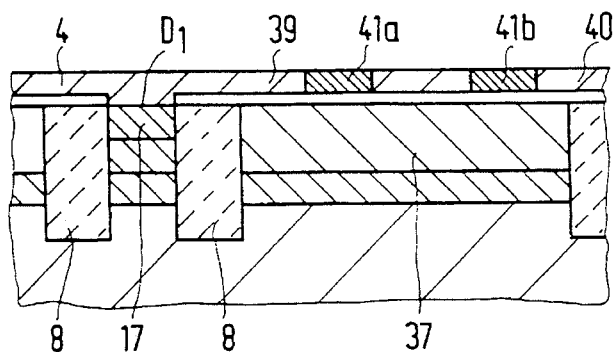
FIG. 13 shows a modification of the first embodiment in the same cross-section as that shown in FIG. 5.

The zone 37 forms a joint gate electrode for the selection transistors in the first and the third poly track 4. Similarly, the zone 38 forms a joint gate electrode for the selection transistors 19 in the second and the fourth poly track 4 (counted from top to bottom in FIG. 4). An undesirable transistor effect is avoided in places where the zones cross the n-type poly tracks, such as shown in FIG. 5, for example, by the zone 38 which crosses the upper poly track, in that the doping in the n-type region 40 is chosen to be sufficiently strong. The zone 17 of the diodes $D_1$ and the gates 37 and 38 are separated from one another within the semiconductor body by grooves 8. In a modification of the embodiment shown here, as shown in FIG. 13, several regions 41a, 41b, etc. may be provided above a gate region, for example, the gate region 37 so as to increase the maximum admissible voltage. The cascode principle is used for this, i.e. a voltage is applied across each pn junction which is much lower than the total voltage across the transistor.

It is evident from the diagram of FIG. 1 that more space is available for the transistors 22 and 24 than for the transistors 19, so that it may be possible in some cases to manufacture transistors (22, 24) in the semiconductor body 1 in a conventional manner. As is shown in FIG. 4, the selection transistors 22 and 24 may alternatively be constructed as thin-film transistors in the same way as the transistors 19. The gate electrodes of transistors 22 and 24 are formed by p-type surface zones 42 and 43, respectively, with which the conduction in the channel regions 44 formed by p-type portions of the poly tracks can be controlled.

Since the selection transistors 19 and in the present example also the transistors 22 and 24 are constructed as thin-film transistors, the selection transistors do not constitute a constraint as to the minimum pitch for the row conductors 4, so that it is possible to construct the memory with a very small pitch. The risk of electrical breakdown between the transistors is comparatively small and forms no or substantially no constraint to the further reduction of the dimensions because the transistors 19 are at least substantially mutually separated by dielectric material 10, 13.

It is noted that the p-type zones 17, 37, 38, 42 and 43 within the semiconductor body are electrically insulated from one another, while voltages to be applied during operation are so chosen that the pn junctions between these zones and the n-type material of the body are reverse biased.

Figure 6:
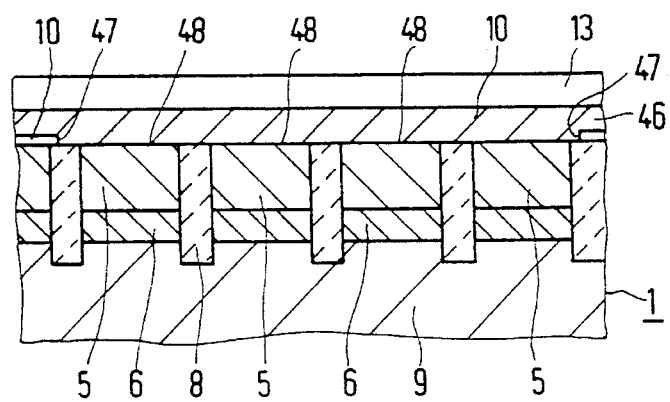
FIG. 6 is a cross-section of this device at the area of the precharge diodes of the column conductors.
Figure 7:
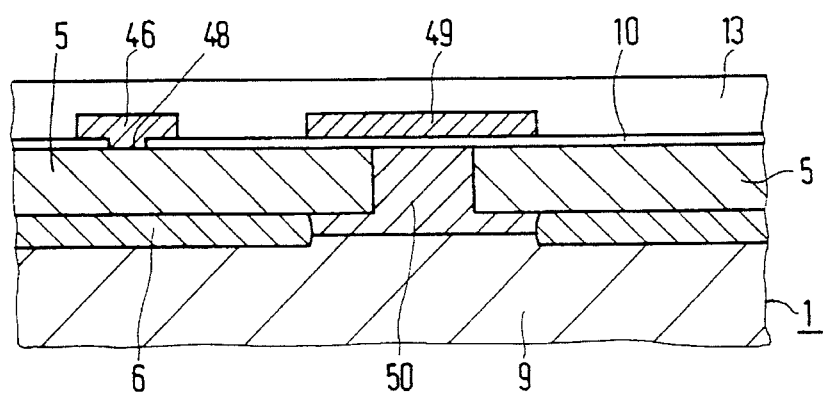
FIG. 7 is a cross-section of this device at the area of a selection transistor of a column conductor.

The means 16 are constructed in a similar manner such that minimum dimensions can be obtained again through the absence of contacts. Just as the diodes $D_1$ and the transistors 19 are manufactured in the row conductors 4 as much as possible, the diodes $D_2$ and the selection transistors 38 can be provided in the column conductors 5 for the major part. FIG. 6 shows in a cross-section parallel to the cross-section of FIG. 3 how the diodes $D_2$ are formed. The column conductors are for this purpose prolonged to outside the memory matrix 3 and remain separated from one another by the insulation regions 8 also outside the memory matrix. An n-type poly track 46 is provided above the surface, insulated therefrom by the oxide layer 10 and formed simultaneously with the row conductors 4. A window 47 is provided in the oxide layer 10 where the n-type poly track 46 forms pn junctions 48 with the column conductors 5, which pn junctions form the precharge diodes $D_2$. The selection transistors 28 are formed beyond the diodes $D_2$. To illustrate this, FIG. 7 shows a cross-section of a portion of a column conductor in a direction transverse to the cross-section of FIG. 6. The left-hand part of the drawing shows the n-type poly track 46 which forms the pn junction 48 with the p-type column conductor 5. Next to the poly track 46 and at some distance therefrom, the poly track 49 is provided, insulated from the surface of the semiconductor body by the oxide 10. The poly track forms the gate electrode of the selection transistor 28 associated with this column conductor 5, the source and drain zones of this transistor being formed by portions of the column conductor which is provided with an interruption 50, formed by n-type material of the original epitaxial layer, at the area of the channel region below the gate electrode 49. It is possible in this manner also to connect the column conductors to selection transistors without contacts, so that also the column conductors can be manufactured with minimum pitch. Since furthermore the transistors are mutually separated by the grooves 8, the risk of breakdown between the transistors is comparatively small, at least considerably smaller than with the usual field oxide between adjoining transistors, as long as voltages of usual values are applied.

Figure 8:
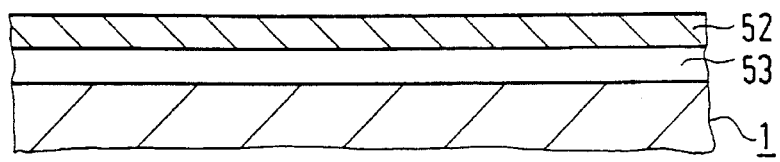
FIGS. 8–10 show a second embodiment of a semiconductor device according to the invention in cross-section in a few stages of its manufacture.
Figure 9:
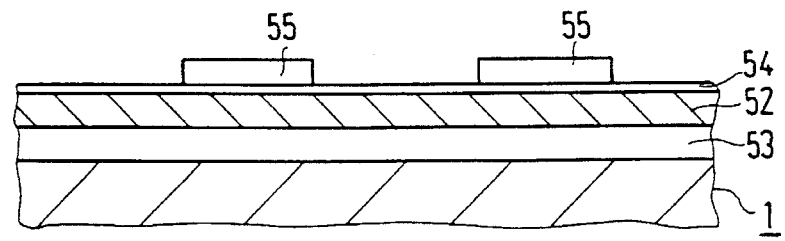
Figure 10:
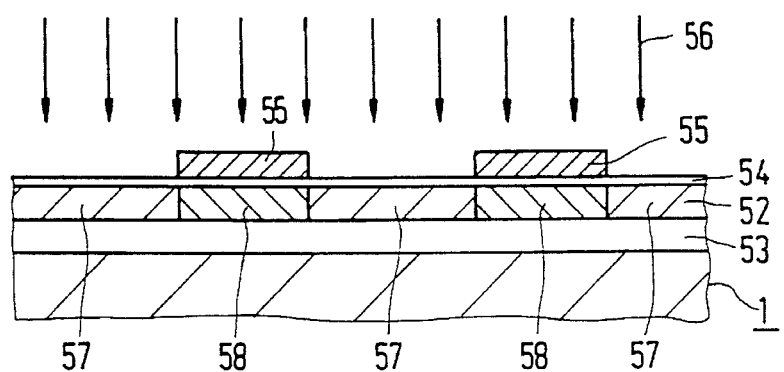

In circuits comprising two or more poly layers, a gate electrode in one of these poly layers may be used for the thin-film transistor instead of a diffused gate electrode in the semiconductor body. To illustrate this, FIGS. 8–10 show a portion of another embodiment of a device according to the invention in a few stages of manufacture. The drawing only shows a portion of the device with the selection transistors. FIG. 8 shows the device in the stage in which the first poly layer 52 is provided, in which layer a selection line is manufactured. The layer 52 is, for example, weakly p-type doped. Since the gate electrode is not formed by a surface zone in the substrate 1, the dielectric layer 53 between the substrate 1 and the poly layer 52 may have any thickness as desired. The surface of the poly layer 52 is provided with a thin dielectric layer 54, for example an oxide layer, which forms the gate dielectric of the selection transistors (FIG. 9). On the layer 54 a second poly layer is deposited, from which gate electrodes 55 of the selection transistors are formed, for example by photolithography. In a next stage (FIG. 10), an n-type dopant is provided in the poly layers, for example by means of ion implantation, diagrammatically indicated with arrows 56. The gate electrodes 55 and portions of the layer 52 not masked against implantation by the electrodes 55 are n-type doped thereby. The n-type doped portions 57 of the poly layer 52 form the source and drain zones of the thin-film transistors, while the p-type doped portions 58 of the layer 52 form channel regions of the selection transistors.

Figure 11:
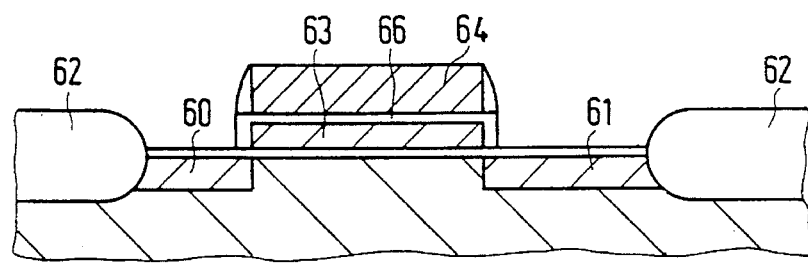
FIGS. 11 and 12 are cross-sections of a further embodiment of a semiconductor device according to the invention.
Figure 12:
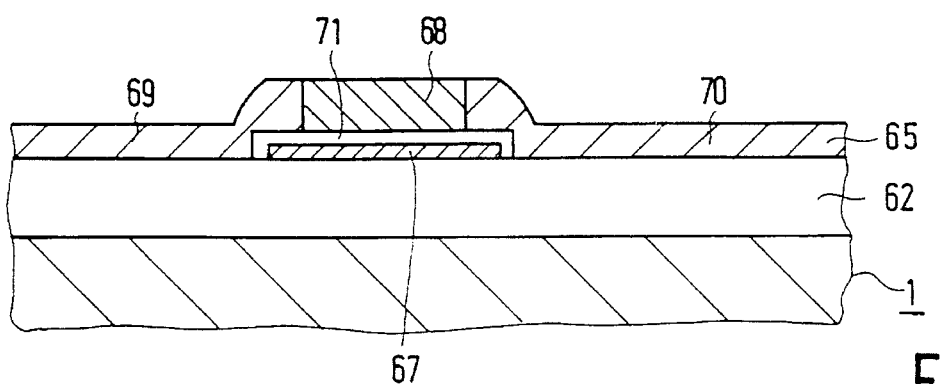

FIG. 12 shows in cross-section an embodiment of a selection transistor which is particularly suitable for use in a non-volatile memory with floating gate. FIG. 11 shows a memory cell of such a memory, referred to in the literature as EEPROM, EPROM, or Flash-(E)EPROM. The cell comprises a transistor with source and drain zones 60 and 61 provided in an active region which is limited within the semiconductor body by the field oxide 62. A floating gate electrode 63 is provided in a first poly layer above the channel region. As is generally known, the information is written into the floating gate and stored in the form of electric charge which defines the threshold voltage of the transistor. Above the floating gate, a control gate 64 is provided in a second poly layer, insulated from the floating gate 63 by the interpoly dielectric 66. The control gate 64 is connected, for example, to a word line, while the drain zone 61 is connected to a bit line. In FIG. 12, the word line has the reference numeral 65 and extends over the field oxide 62 in the form of an n-type doped poly track. The gate electrode 67 of the selection transistor is provided in the same poly layer as the floating gate 63. The channel of the selection transistor is formed by the comparatively weakly doped p-type portion 68 of the poly track 65 which is manufactured in the same poly layer as the control gate 64 of the floating-gate transistor. The source and drain zones of the selection transistor are formed by the strongly doped n-type poly portions 69, 70 situated on either side of the channel region 68. Since the selection transistor can be manufactured in a self-aligned manner, the gate electrode extends to below the source and drain zones on either side of the channel. The channel region 68 is insulated from the gate electrode 67 by the gate dielectric 71 which may be of the same composition as, and accordingly formed simultaneously with the interpoly dielectric 66 between the floating gate 63 and the control gate 64.

It will be obvious that the invention is not limited to the embodiments given here but that many more variations are possible to those skilled in the art within the scope of the invention. Thus several of the types of selection transistors described here may be used in a memory or even in a selection line. It is also possible to use transistors of the depletion type instead of transistors of the enhancement type. The invention may be advantageously applied not only to the types of memory devices described here but also to other memory devices known per se. It is further noted that the selection diagram 15, 16 drawn in FIG. 1 may be used to advantage in embodiments in which the entire memory matrix 3 is constructed in polycrystalline silicon. In that case, the transistors 28, 31 and 33 can be constructed as TFTs.

What is claimed is:

1. A semiconductor device with a semiconductor body which is provided at a surface with a system of memory elements arranged in rows and columns and with a system of mutually adjacent, parallel selection lines which form one of row and column conductors for addressing the memory elements and which are each connected at an end to a selection transistor for forming a switchable connection between said conductor and a peripheral electronic circuit, characterized in that the selection transistors are integrally formed with said conductors by thin-film field effect transistors provided in a semiconductor layer provided on an insulating layer which covers the semiconductor body.

2. A semiconductor device as claimed in claim 1, characterized in that mutually adjacent conductors are electrically insulated from one another by an interposed layer of electrically insulating material.

3. A semiconductor device as claimed in claim 1, characterized in that the conductors are connected to a decoding circuit via the selection transistors.

4. A semiconductor device as claimed in claim 3, characterized in that the decoding circuit comprises at least one insulated-gate transistor which is also provided, at least partly, in a portion of the conductor track which forms an extension of the conductor.

5. A semiconductor device as claimed in claim 1, characterized in that the conductors each comprise a conductor track of doped silicon, and in that the selection transistor is formed by a field effect transistor whose source and drain zones are provided in said conductor track of doped silicon, while the portion of the conductor track situated between the source and drain zones forms the channel region of the transistor, which region is separated from a gate electrode by a dielectric layer.

6. A semiconductor device as claimed in claim 5, characterized in that the source and drain zones of the selection transistor and the silicon of the conductor are of the same conductivity type, retorted to as the first conductivity type hereinafter.

7. A semiconductor device as claimed in claim 5, characterized in that the source and drain zones and the channel region of the selection transistor extend over the full width of the conductor track.

8. A semiconductor device as claimed in claim 5, characterized in that the conductor track is electrically insulated from the semiconductor body by the dielectric layer at the an area of the selection transistor, and the gate electrode is formed by a surface zone of the semiconductor body.

9. A semiconductor device as claimed in claim 5, characterized in that the conductors each form one of a word and bit line of a programmable read-only memory, while the conductors are formed by conductor tracks of polycrystalline silicon of a first conductivity type which, seen at a surface, cross strip-shaped surface regions of the second, opposed conductivity type defined in the semiconductor body, lying next to one another, and electrically insulated from one another, and which are separated from these surface regions by an interposed insulating layer whose thickness is so chosen that, upon an application of a sufficiently high voltage between a selected row conductor and a selected surface region, electric breakdown occurs across the insulating layer at an area of a crossing point under formation of a pn junction between the row conductor and a surface region in the semiconductor body.

10. A semiconductor device as claimed in claim 5, characterized in that the conductor forms a word line of a non-volatile programmable memory in which each memory element comprises a field effect transistor with a floating gate provided above a channel of the field effect transistor and with a control gate which is conductively connected to the word line.

11. A semiconductor device as claimed in claim 10, characterized in that the non-volatile memory forms a flash-EPROM.

12. A semiconductor device as claimed in claim 5, characterized in that the gate electrode is formed by a conductive layer which is situated between the semiconductor body and the portion of said conductor track in which the source and drain zones and the channel region of the selection transistor are defined.

13. A semiconductor device as claimed in claim 12, characterized in that the conductor forms a word line of a non-volatile programmable memory in which each memory element comprises a field effect transistor with a floating gate provided above a channel of the field effect transistor and with a control gate which is conductively connected to the word line.

14. A semiconductor device as claimed in claim 14, characterized in that the gate electrode of the selection transistor and the floating gate of the memory element are manufactured from a common conductive layer.

* * * * *